United States Patent [19]

Rzedzian

[11] Patent Number: 4,628,264
[45] Date of Patent: Dec. 9, 1986

[54] NMR GRADIENT FIELD MODULATION

[75] Inventor: Richard R. Rzedzian, Lexington, Mass.

[73] Assignee: Advanced NMR Systems, Inc., Woburn, Mass.

[21] Appl. No.: 589,539

[22] Filed: Mar. 14, 1984

[51] Int. Cl.$^4$ ............................................. G01R 00/00
[52] U.S. Cl. .................................... 324/322; 324/318; 324/307
[58] Field of Search ............... 324/309, 313, 314, 318, 324/322, 311, 307; 307/252 A, 252 C, 252 J, 252 K, 252 N, 252 P, 252 Q, 252 T

[56] References Cited

U.S. PATENT DOCUMENTS

| 3,504,204 | 3/1970 | Carrive | 307/252 N |
| 3,723,769 | 3/1973 | Collins | 307/252 T |
| 4,051,429 | 9/1977 | Imanari et al. | 324/311 |
| 4,165,479 | 8/1979 | Mansfield | 324/313 |
| 4,280,096 | 7/1981 | Karthe et al. | 324/309 |
| 4,315,216 | 2/1982 | Clow et al. | 324/309 |
| 4,322,684 | 3/1982 | Hounsfield | 324/309 |
| 4,354,157 | 10/1982 | Feiner | 324/309 |
| 4,384,255 | 5/1983 | Young et al. | 324/309 |
| 4,424,488 | 1/1984 | Hounsfield | 324/309 |
| 4,509,015 | 4/1985 | Ordidge et al. | 324/309 |
| 4,531,094 | 7/1985 | Ordidge et al. | 324/309 |

FOREIGN PATENT DOCUMENTS

| 0076054 | 4/1983 | European Pat. Off. | 324/309 |
| 58-63841 | 4/1983 | Japan | 324/309 |
| 2107469 | 4/1983 | United Kingdom | 324/309 |

Primary Examiner—Stewart J. Levy
Assistant Examiner—Kevin D. O'Shea
Attorney, Agent, or Firm—Ostrolenk, Faber, Gerb & Soffen

[57] ABSTRACT

A circuit and method are disclosed for providing high, constant amplitude sinusoidally modulated NMR gradient fields. A capacitor is connected in parallel with the gradient coil, but separated by a switch. A pre-determined amount of energy is stored in the capacitor and then the switch is closed to permit a sinusoidal oscillation of energy between the capacitor and gradient coil. By precharging appropriately, sine wave or cosine wave oscillation can be obtained for the NMR system. The oscillation is terminated by opening the switch at a time when all of the oscillating energy is in the capacitor. In a preferred embodiment of the invention, the switch is a bridge circuit, each of whose sides is a back-to-back thyristor pair, so that the gradient field may be modulated either as a full wave, half-wave rectified or non-rectified sinusoidal oscillation. In one embodiment, a full-wave rectified sine wave is used, and all the oscillating energy is caught in the capacitor during intervals in which 180° RF pulses are applied to generate echoes. Image data is collected during the sinusoidal oscillation.

32 Claims, 18 Drawing Figures

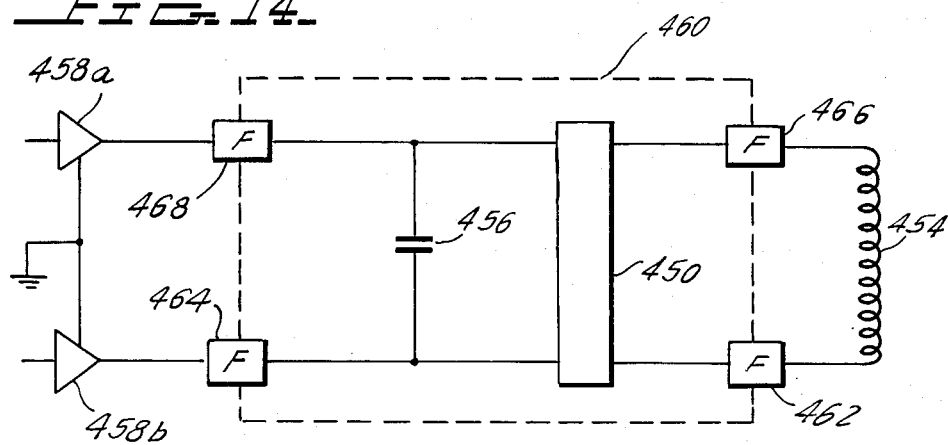
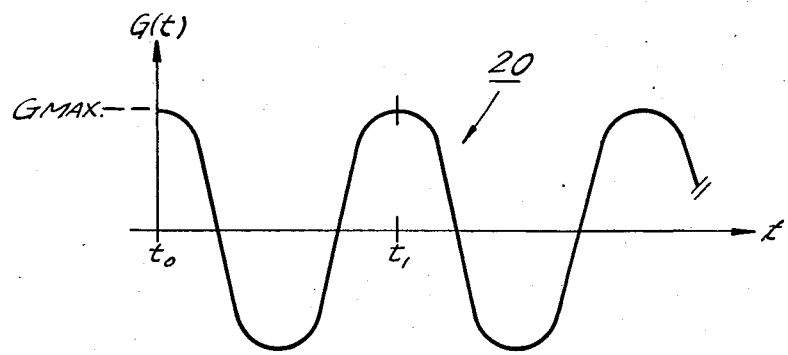
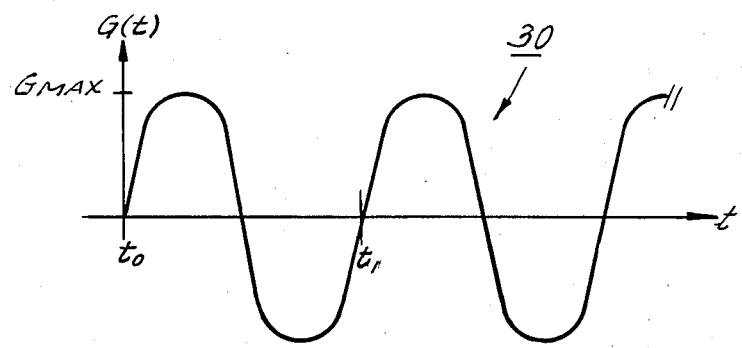

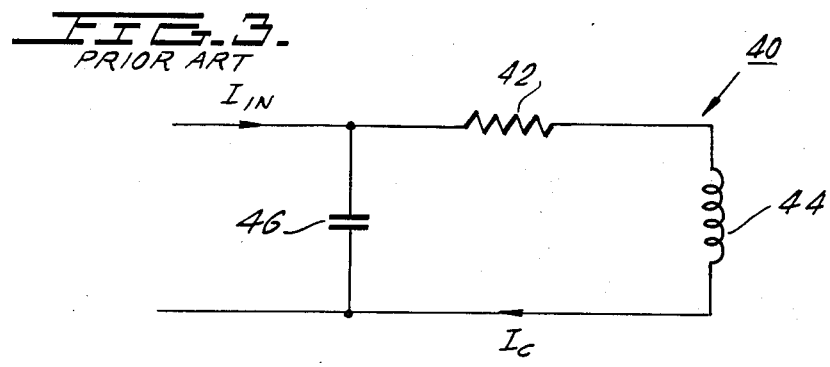
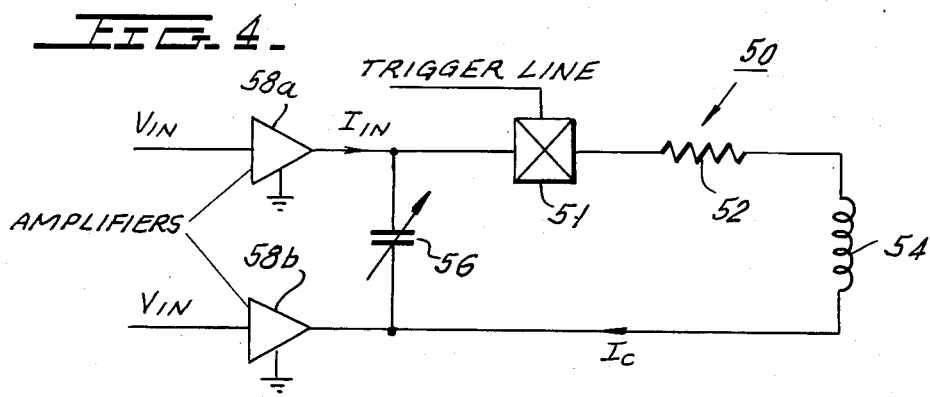
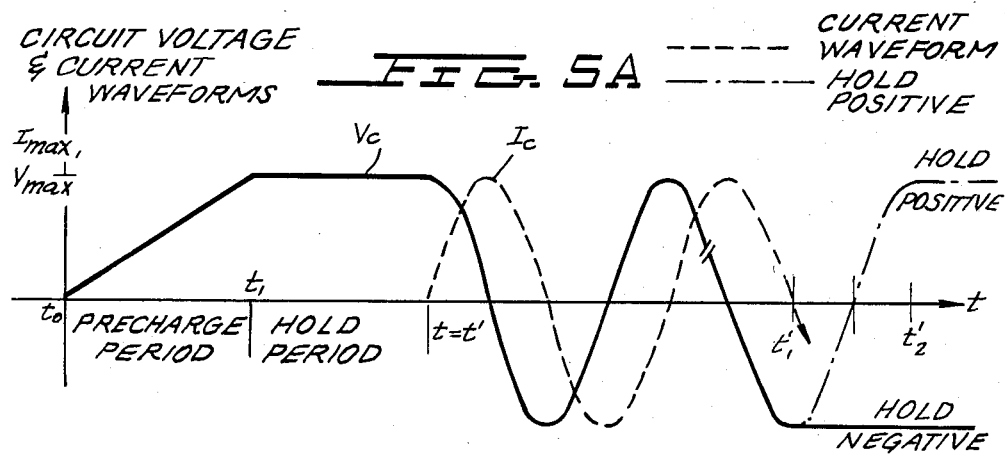
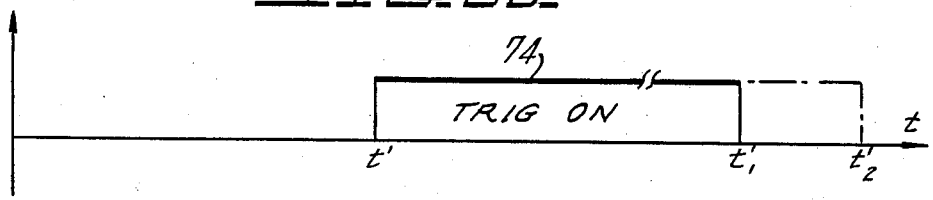

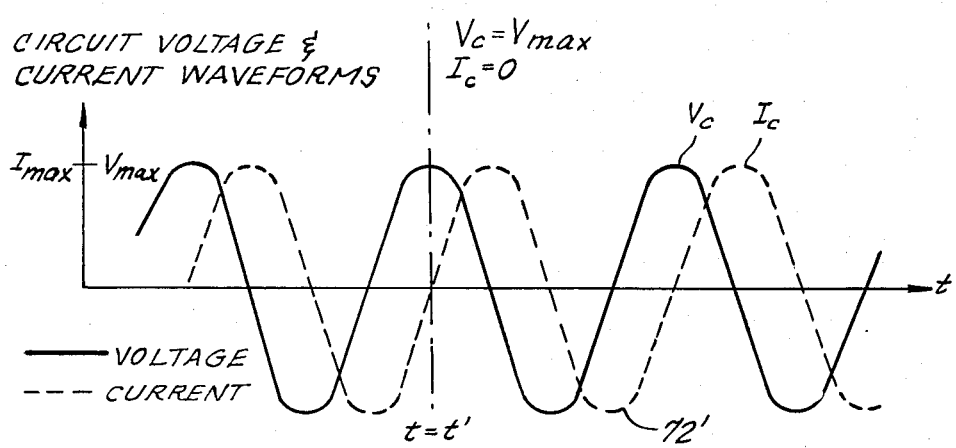
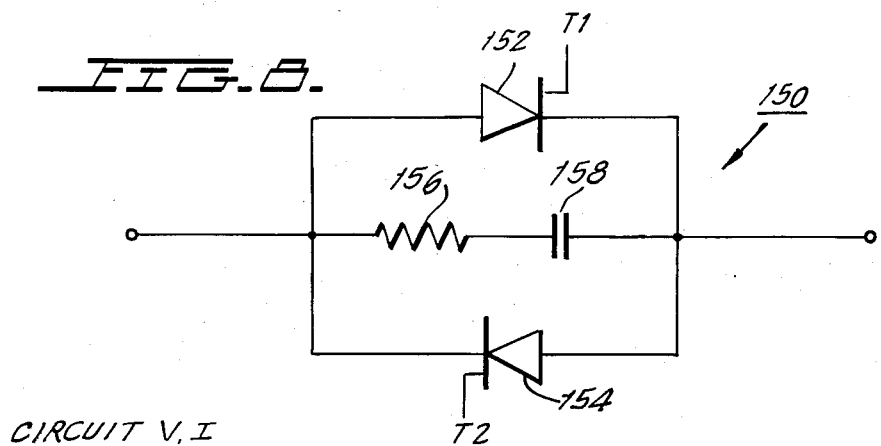
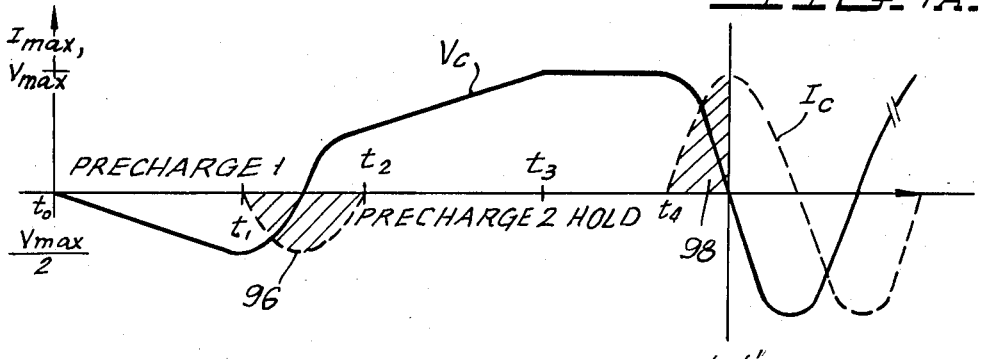
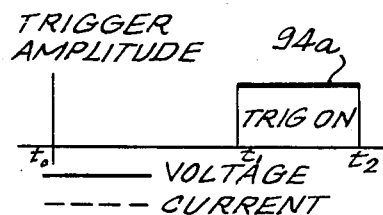

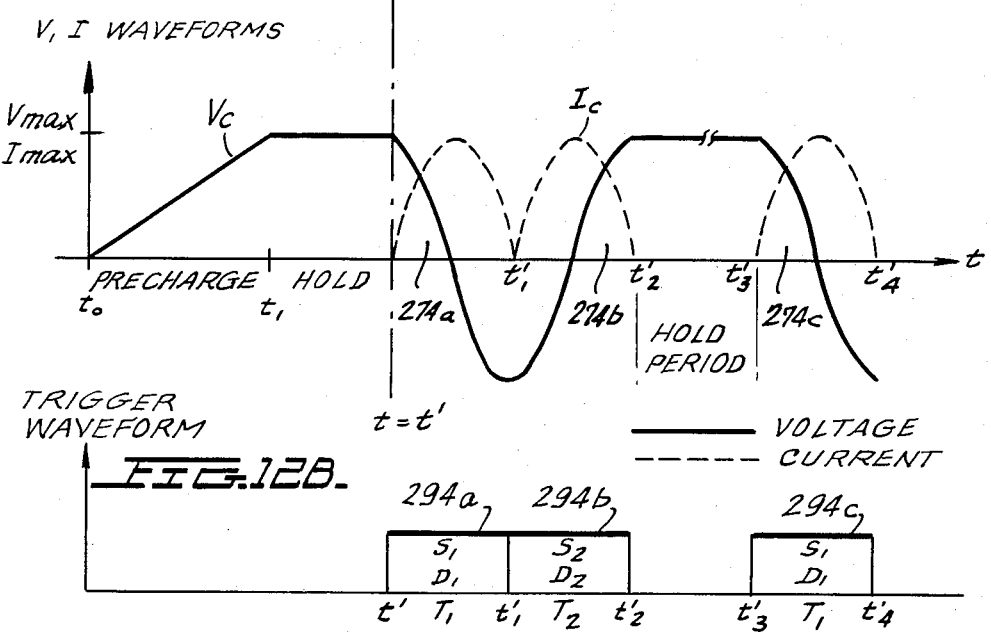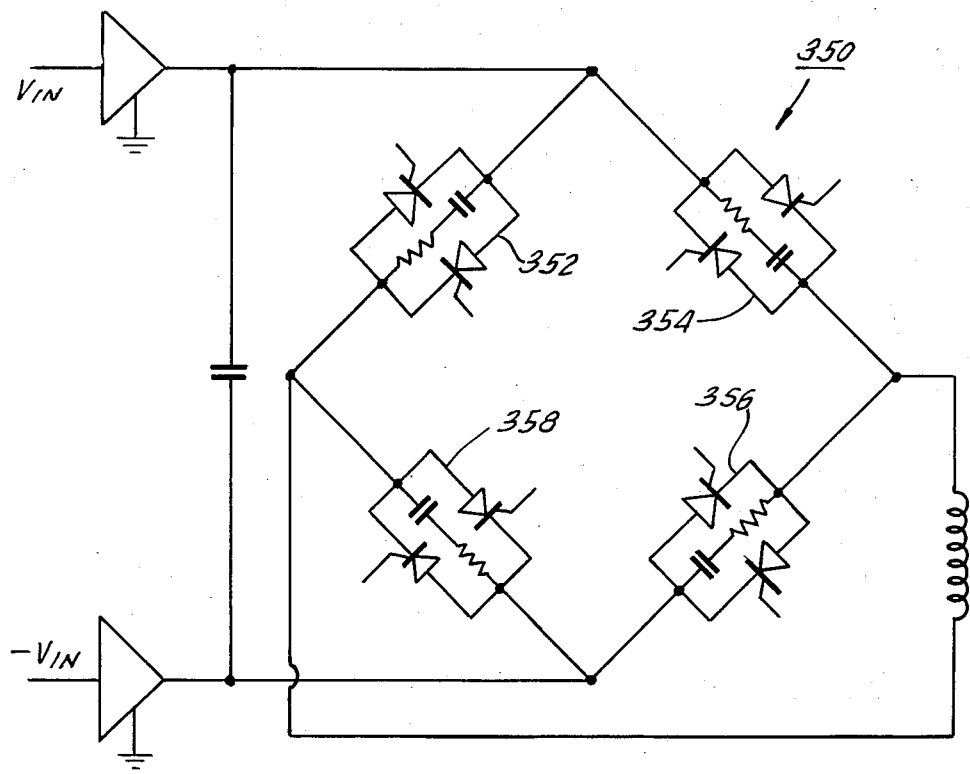

NMR GRADIENT FIELD MODULATION

BACKGROUND OF THE INVENTION

1. Field of the Invention

The present invention relates to circuitry used to provide a modulated gradient field in a nuclear magnetic resonance (NMR) detection system and to methods of modulating an applied gradient field.

2. Description of the Prior Art

In previous NMR detection systems, especially imaging systems, it is known to apply a modulated gradient field. For example, U.S. Pat. No. 4,165,479, issued to Mansfield, discloses both square and sinusoidal gradient modulation. Similarly, U.S. Pat. No. 4,322,684, issued to Hounsfield, discloses pulses of sinusoidally modulated signals applied to a gradient coil through a digital to analog converter. Other examples of NMR systems in which the gradient field is modulated include the following: U.S. Pat. No. 4,354,157, issued to Feiner, disclosing amplitude modulation using a cosine function; U.S. Pat. No. 4,280,096, issued to Karthe et al., in which the gradient coils are operated by discrete pulses; and U.S. Pat. No. 4,315,216, issued to Clow et al., in which the gradient pulse is a distorted sinusoid.

More recently, U.S. Pat. No. 4,384,255, issued to Young et al., discloses a particular circuit for providing pulses to gradient coils. The pulses applied in the disclosed system, however, are not sinusoidal, but rather are ramped.

None of the known prior art recognizes that a strong sinusoidal gradient field cannot be produced using known techniques without undesirable transient effects. Specifically, many cycles of sinusoidal oscillation may be necessary before a strong field of the desired amplitude will be obtained. In certain applications, however, such as high-speed NMR imaging, a strong gradient field sinusoidally modulated at audio frequencies is necessary. Although some of the known devices described above disclose pulsed sinusoidal gradients, it would be useful to have specific circuitry capable of providing such a gradient field without transients and additional methods for making optimal use of such circuitry.

In high-speed NMR imaging, information is collected from the imaged subject very rapidly, typically within several tens of milliseconds. The information collected, referred to herein as image data or imaging information, may represent a two or three dimensional spatial distribution. For this purpose, it is necessary to spatially encode the image data because the image data is ordinarily received as one dimensional time-varying data reflecting a parameter of the subject being imaged, such as water content. The necessary spatial encoding, in order to be meaningful, must also be performed at high speed, concurrently or interleaved with the image data collection. The spatial encoding is typically performed by gradient fields as explained in greater detail below.

Several design constraints apply to a high-speed NMR imaging system. If the image data is presented for display in a two-dimensional matrix format, for example, each element of the matrix will describe a finite volume element of the subject being imaged. Since the collected image data is time varying, it is desirable to represent each finite volume element by an associated band of frequencies $\Delta f$. From the basic equation defining the angular resonance frequency $\omega$ in terms of the gyromagnetic ratio $\gamma$ and the magnetic field B, $$\omega = \gamma B, \tag{1a}$$

we can obtain the relationship:

$$2\pi \Delta f = \gamma G_x \Delta x. \tag{1b}$$

In Equation (1b), $\gamma$ is a constant, $G_x$ is the magnetic field gradient in the x-direction, assumed to be the only gradient field applied, and $\Delta x$ is the linear dimension of the finite volume element in the x-direction. This equation can be used to calculate the magnetic field gradient necessary to represent a finite volume of a particular size $\Delta x$ over a frequency band of a particular width $\Delta f$. If the image is an $N \times N$ matrix, the total frequency span for the image will be $N^2 \Delta f$. Typically, N may be 128.

The lower limit on the frequency band $\Delta f$ for each finite volume element is determined by the field inhomogeneities. The ultimate natural limit will be $1/T_2$, where $T_2$ is one NMR relaxation time. Using the above equations and assuming an image aperture of 40 cm, the total band width necessary for a $128 \times 128$ display matrix would typically be 1 MHz, and the field gradient required would be 6.25 gauss/cm. This is an extremely strong gradient field. The typical gradient fields available today achieve a maximum of 1 gauss/cm.

A further design constraint is that high-speed imaging is ordinarily performed using echoes, discussed in greater detail below. In some applications, these echoes are produced by the gradient field, which must therefore be modulated at audio frequencies such as several KHz. Because the typical gradient system now in use has a "ramp-up" time of one millisecond, an oscillation of the necessary frequency and amplitude is impossible to obtain. Furthermore, the power requirements for achieving an undistorted oscillation would be on the order of a megawatt, given the size of the gradient coils required.

SUMMARY OF THE INVENTION

The present invention solves these problems by providing circuitry and methods for modulation of NMR gradient fields, making high-speed NMR imaging practical. The power requirements of the present invention are substantially reduced because energy is stored in a capacitive circuit prior to the beginning of oscillation.

A primary object of the present invention is thus to provide circuitry capable of generating strong gradient fields sinusoidally modulated at audio frequencies and controlled in such a manner that pulsed sinusoidal gradient fields may be applied without undesirable transient effects. Specifically, an object of the present invention is to provide sine and cosine wave gradient fields which can be instantaneously applied and removed through a large inductance gradient coil of the type used for imaging a human body.

Another object of the present invention is to provide a circuit for modulating the gradient field which causes current to flow through the gradient coil in only one direction.

A further object of the present invention is to provide methods of NMR imaging in which a sinusoidally modulated gradient field is employed.

These and other objects of the invention are accomplished by a circuit for generating a gradient field for a nuclear magnetic resonance system and by a method of imaging with a nuclear magnetic resonance system having a gradient coil arranged near a subject.

The circuit of the present invention includes input power circuitry for providing an input voltage. A capacitor, which may be adjustable to obtain a range of modulation frequencies, stores energy from an input circuit. A switch connected to the capacitor may be closed to permit the stored energy to oscillate at a resonant frequency between the capacitor and a gradient coil which generates the gradient field. In this manner, the gradient field is modulated at the resonance frequency.

In one embodiment, the switch includes back-to-back, or anti-parallel, thyristors so that the direction of current flow between the capacitor and the gradient coil may be controlled. In another embodiment, the switch circuit includes a bridge circuit for permitting current to flow through the gradient coil in only one direction. In yet another embodiment, the bridge circuit has four sides, each of which includes a pair of back-to-back thyristors for controlling the flow of current in any desired fashion.

The method of operation of the circuit of the invention begins with the storing of energy in a capacitor. A switch is then closed to permit current to flow between the capacitor and the gradient coil. A sinusoidal oscillation is maintained at a resonant frequency in the capacitor and gradient coil by use of power amplifiers. During the oscillation, imaging information may be collected from the subject. Then the switch is opened to stop the sinusoidal oscillation at a time when the oscillating energy is in the capacitor.

In one embodiment, a predetermined amount of energy is stored in the capacitor and then is held until the switch is closed. In this embodiment, the closing of the switch initiates a sine wave oscillation.

In an alternative embodiment, an initial amount of energy is first stored in the capacitor with a reversed polarity. This initial energy is then released through the gradient coil by closing the switch and returns to the capacitor with a forward polarity. The switch is then opened and additional energy is provided by the input circuit until the stored energy reaches the predetermined amount. After this preparation, the switch is again opened and the spin phase accrued in the nuclear systems of the subject from the initial amount of energy is cancelled by the first quarter cycle of sine wave oscillation. As a result, the oscillation causes spin phase to accrue as if it were a cosine wave oscillation rather than a sine wave.

In another embodiment of the method of the invention, the predetermined amount of energy is held in the capacitor after the oscillation is stopped. This permits repeating the method steps to collect further imaging information after a period of phase-encoding or other processing.

Other objects, features and advantages of the invention will be apparent from the following description, together with the accompanying drawings and the appended claims.

BRIEF DESCRIPTION OF THE DRAWINGS

FIG. 2A shows the sine wave form of sinusoidal oscillation of a gradient field.

FIG. 2B shows the cosine wave form of sinusoidal oscillation of a gradient field.

FIG. 3 is a schematic diagram of a conventional tuned RLC circuit.

FIG. 4 is a schematic diagram of one embodiment of the tuned RLC circuit of the invention.

FIG. 5A shows the voltage and current waveforms resulting from one embodiment of the method of the invention.

FIG. 5B shows the trigger waveform used to obtain the waveforms of FIG. 5A.

FIG. 6 illustrates the relationship between voltage and current waveforms across the capacitor in the tuned circuit of the invention.

FIG. 7A shows a second set of voltage and current waveforms resulting from one embodiment of the method of the invention.

FIG. 7B shows the trigger waveform used to obtain the waveforms of FIG. 7A.

FIG. 8 is a schematic diagram of one embodiment of the switch used in the tuned circuit of the invention.

FIG. 12A shows a further set of voltage and current waveforms resulting from another embodiment of the method of the invention, producing a rectified sine wave current through the gradient coil.

FIG. 12B shows the trigger waveform used to obtain the waveforms of FIG. 12A.

FIG. 13 is a schematic diagram of a third embodiment of the tuned circuit of the invention in which the switching circuit comprises a bridge circuit with back-to-back thyristors on each side.

FIG. 14 is a schematic diagram of a general embodiment of the invention including filtering circuitry.

DETAILED DESCRIPTION OF THE PREFERRED EMBODIMENT

1. General Operation

Figure 1:
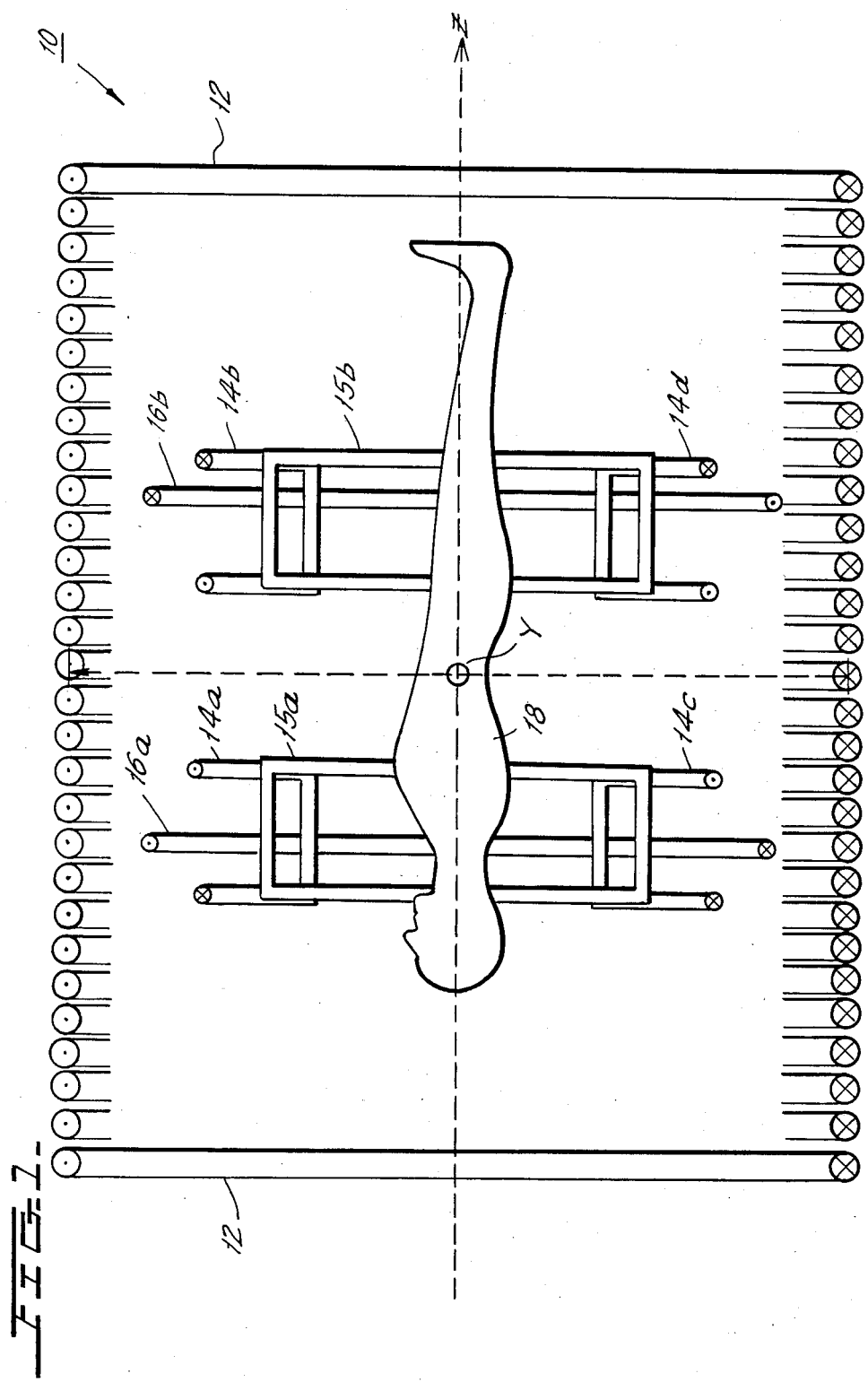
FIG. 1 is a cross-sectional view of an arrangement of NMR gradient coils arranged around a subject.

The general operation of the invention may be understood from FIGS. 1, 2A and 2B. FIG. 1 shows gradient coils mounted in relation to a body for imaging while FIGS. 2A and 2B show waveforms which may be applied to the gradient coils in accordance with the invention.

Magnetic coils 10, as shown in FIG. 1, are oriented in relation to x, y, and z axes. The whole-body coil 12 is a solenoidal magnet which will conduct a current and generate a static, uniform magnetic field $H_z$ surrounding body 18. Gradient coils 14, 15 and 16 are arranged to provide a gradient field combining components $G_x$, $G_y$ and $G_z$ in the respective x, y, and z directions. As shown in FIG. 1, the current through coils 16a flows in the opposite direction from the current through coil 16b, so that $G_z$ varies from a maximum in one polarity in the plane of coil 16a to a maximum in the opposite polarity in the plane of coil 16b. Coils 14 and 15 are saddle-shaped coils of the type conventionally used in NMR imaging. Current will flow through coils 14a and 14b, as shown, resulting in a component of magnetic flux between coils 14a and 14b in a direction opposite to the component generated by current through coils 14c and 14d. Therefore, the gradient field will vary in the x- direction, resulting in $G_x$. Coils 15a and 15b, together with two symmetrically opposite coils (not shown), will similarly produce $G_y$.

The gradient field components $G_x$, $G_y$, and $G_z$ produced by coils 14, 15, 16 perform a spatial encoding function. The gradient fields applied to body 18 will enable NMR information to be obtained about a selected part of body 18, such as an image plane. More specifically, since $G_x$, $G_y$, $G_z$ and $H_z$ combine at each point in body 18 to define the magnetic field B, in Equation 1a above, the resonance frequency $\omega$ at each point in body 18 will depend on $G_x$, $G_y$, $G_z$ and $H_z$. Since $H_z$ is constant, the frequency $\omega$ will be spatially coded according to the variations of $G_x$, $G_y$, and $G_z$. In other words, each point in body 18 will have a corresponding frequency $\omega$ resulting from the $G_x$, $G_y$, and $G_z$ components at that point and their time variations.

For some applications, oscillating gradient field components $G_x$, $G_y$, $G_z$ are desirable. The waveform shown in FIG. 2A is an example of an oscillating gradient of the form $$G(t) = G_{max} \sin \omega t.$$

FIG. 2B shows a wave form in which $$G(t) = G_{max} \cos \omega t.$$

In general, this application will refer to a waveform like that shown in FIG. 2A as a sine wave and a waveform like that in FIG. 2B as a cosine wave. For purposes of this application, both sine waves and cosine waves, unrectified or rectified, are types of sinusoidal oscillations.

The circuitry and methods of the present invention, produce gradient fields whose waveforms are sine and cosine waves, without undesirable transients. In addition, the present invention can produce variations of the sine and cosine waves which have further advantages.

2. First Embodiment

In order to produce sinusoidally oscillating gradient waveforms like those shown in FIGS. 2A and 2B, it is necessary to produce sinusoidally oscillating current waveforms of the same shape through at least one of the coils 14, 15, 16. Thus the current waveform will be $$I(t) = I_{max} \sin \omega t$$

for the sine wave and $$I(t) = I_{max} \cos \omega t$$

for the cosine wave. A current waveform of this sort can be maintained in a tuned parallel circuit 40 like that shown in FIG. 3. Circuit 40 includes a resistor (R) 42, an inductor (L) 44, and a capacitor (C) 46. As applied to an NMR gradient coil, inductor 44 represents the lumped gradient coil inductance, resistor 42 represents the total circuit losses, primarily in the coil, and capacitor 46 is the tuning capacitance used to obtain the desired modulation frequency $\omega_o$. Circuit 40 may be used to drive several gradient coils 44 in series, or separate circuits may be used to drive some or all of the gradient coils 44 in parallel. As is well known, the modulation frequency will be governed by the equation:

$$\omega_o^2 = 1/LC. \tag{2}$$

In evaluating a tuned circuit like that shown in FIG. 3, the input current $I_{in}$, may be compared with the current through the coil $I_c$, and the quality factor Q may be defined as:

$$Q = I_c/I_{in}. \tag{3}$$

As is well known, for the simple tuned parallel circuit shown in FIG. 3:

$$Q = \omega_o L/R. \tag{4}$$

Therefore, if R can be made small, the amplitude $I_{max}$ of coil current $I_c$ can be made large leading to a large gradient field amplitude. For typical NMR applications, $\omega_o L$ in Equation 4 may be as large as 0.5 ohms, while R may be as low as 25 milliohms, resulting in a Q factor of 20. Hence a circulating coil current $I_c$ of 500 amperes could be obtained with an input current $I_{in}$ of only 25 amperes.

The use of a tuned circuit as shown in FIG. 3 to produce the sine wave of FIG. 2A and the cosine wave of FIG. 2B requires some additional means for switching the current on and off in such a manner that the sine and cosine wave begin and end at full amplitude, $G_{max}$. It is impossible to begin the cosine wave 20 at $t_o$, as shown in FIG. 2B, with $G(0) = G_{max}$ because some time would be required for $I_c$ to reach $I_{max}$. Similarly, an initial rise time, $\tau$, characterizes the growth of the gradient field sine wave 30 of FIG. 2A toward full oscillation amplitude beginning at $t_o$ as shown in FIG. 2A. If the single period of oscillation between $t_o$ and $t_1 = 2\pi/\omega$ is designated T, rise time can be calculated using the equation $$\tau = QT/2\pi, \tag{5a}$$

in the characteristic equation:

$$G(t) = G_{max}(1 - e^{-t/\tau}). \tag{5b}$$

If Q=20, approximately 20 oscillations will be required to reach better than 99 percent of $G_{max}$, which would not be acceptable in a total experiment requiring 32 oscillations, for example. In general, the operation of the tuned circuit of FIG. 3 is too sluggish for NMR imaging purposes.

The present invention, a first embodiment of which is shown in FIG. 4, can be used to provide a sinusoidal oscillation which immediately reaches full amplitude. As shown in FIG. 4, circuit 50 includes a switch 51 upstream from resistance 52 and inductor 54. As a result, even when switch 51 is open, capacitor 56 is fully connected to the energy source, in this case amplifiers 58a and 58b. Capacitor 56 can therefore be charged from amplifiers 58A and 58B to an energy E given by:

$$E = CV^2/2. \tag{6}$$

After the necessary energy is stored in capacitor 56, the desired sinusoidal oscillation can be initiated by closing switch 51. When the oscillation is in the steady state, as shown in FIG. 6, the voltage waveform 60' across the capacitor leads the current waveform 72' through the gradient coil by 90° of phase.

As shown in FIG. 4, capacitor 56 is adjustable across a range of values. Since the modulation frequency depends on the capacitance, as seen from Equation (2) above, the modulation frequency can be adjusted by adjusting the capacitor 56. The necessary capacitive circuit could be provided, for example, by providing a fixed capacitor in parallel with an adjustable capacitor for fine tuning. Since modulation frequencies around one KHz are desired, the product of capacitor 56 and inductor 54 should be approximately $10^{-6}$ sec.$^2$, so that a large capacitor may be necessary. In addition, since capacitor 56 will be operating near substantial magnetic fields resulting from the gradient coils, the capacitors should be fully non-magnetic.

FIGS. 5A and 5B show a general example of the waveforms which will result from operation of the invention. The waveform $V_c$ shows the voltage across the capacitor, which will also be the driving voltage waveform from amplifiers 58a, 58b. During precharge period from $t_o$ to $t_1$, $V_c$ goes from the uncharged state of no voltage to the fully charged state in which $V_c = V_{max}$, the voltage necessary to produce a current of $I_{max}$ through the gradient coil. During the hold period from $t_1$ to $t'$ this charge is held in capacitor 56. At $t'$ the oscillations are initiated by closing switch 51. The energy stored in capacitor 56 then begins to oscillate in the tuned circuit 50 resulting in the oscillating current waveform $I_c$ in the tuned circuit. Note that this is indistinguishable from the steady state waveforms $V_c$ and $I_c$ of FIG. 6, after $t = t'$. Since circuit 50 is oscillating at a natural frequency, no transient occurs. As can be seen from FIG. 5A, current waveform $I_c$ is a sine wave and begins at full amplitude $I_{max}$ rather than requiring many oscillations to reach full amplitude. In other words, tuned circuit 50 behaves as though it had already been oscillating, because the state with $V_c = V_{max}$ and $I_c = 0$ is one of the natural states of the oscillating circuit. The sinusoidal oscillation therefore begins at maximum amplitude and provides a high, constant amplitude gradient field.

FIG. 5A also shows switch off times $t'_1$ and $t'_2$. Switch off times $t'_1$ and $t'_2$ occur at voltage maxima so that all of the oscillating energy is stored or caught in capacitor 56. Thus, switch off times $t'_1$ and $t'_2$ may be referred to as "catch times". By holding the oscillating energy in capacitor 56, as shown in FIG. 5A, the tuned circuit 50 is held in a condition in which oscillation may be again begun by closing switch 51. The trigger signal 74 which opens and closes switch 51 is also shown in FIG. 5B. Although a number of signals could be used to control switch 51, the trigger signal 74 shown in FIG. 5B is simple and easy to provide. When trigger signal 74 is low or off, switch 51 is open, but when trigger signal 74 is high or on, switch 51 is closed.

Although tuned circuit 50 will maintain a steady frequency of oscillation, the amplitude will tend to decay due to energy dissipation in resistance 52. Therefore, it is necessary to provide additional energy through amplifiers 58a and 58b. The driving waveform provided by amplifiers 58a and 58b is the same as the voltage waveform $V_c$ shown in FIG. 5A. These driving waveforms can be low amplitude waveforms provided to the amplifiers from an appropriate source, such as a waveform generation system (not shown) used to control the NMR imaging apparatus. For example, digital signals could be provided to a digital-to-analog converter (not shown), which would in turn provide the desired waveform to amplifiers 58a, 58b.

To maximize the power extracted from the amplifiers 58a and 58b, the resistance seen by the amplifiers should be approximately equal to the preferred amplifier load. The resistance seen by the amplifiers will be the equivalent parallel resistance $R_p$, given by:

$$R_p = Q^2 R, \qquad (7)$$

where R represents total circuit loss. If the amplifiers are impedance matched to $R_p$, the current drawn will be given by:

$$I_{in} = V_{max}/R_p \qquad (8)$$

From Equation (3), above, it can be seen that the resulting $I_c$ will depend on the Q-factor of the tuned circuit.

Although FIG. 4 shows a direct connection between amplifiers 58a and 58b and capacitor 56, alternative impedance matching schemes could be used. For example, amplifiers 58a and 58b could be connected to provide input alternating (AC) power to capacitor 56 through power transformers (not shown). Although this would simplify impedance matching, it would eliminate the direct (DC) coupling shown in FIG. 4. Therefore, additional circuitry, such as a constant current trickle device, would be necessary for initially charging and holding a charge in capacitor 56.

By providing an appropriate driving waveform, tuned circuit 50 can also be used to provide a cosine wave to the NMR spin system of the type illustrated in FIG. 7A. As shown there, the voltage waveform $V_c$ representing the driving voltage and the voltage across capacitor 56 follow a substantially more complicated pattern. In the first precharge period from $t_o$ to $t_1$ capacitor 56 is charged with a reverse polarity to $-V_{max}/2$. Initializing trigger pulse 94a, as shown in FIG. 7B, is then applied, which releases the energy stored in capacitor 56 through the gradient coil 54. As a result, the voltage waveform $V_c$ goes through a reversing period from $t_1$ to $t_2$, after which the voltage across capacitor 56 is $+V_{max}/2$. During the reversing period, one current half cycle flows through gradient coil 54, imparting an initializing spin phase to nuclear systems of the NMR subject being imaged. This phase is given by:

$$\phi = a \int_0^t G(t) n \, dt, \qquad (9)$$

where G(t) is the gradient waveform and n is the spin coordinate. In this instance, $G(t) = -(G_{max}/2) \sin \omega t$ and $\phi$ is proportional to area 96. After the reversing period, which lasts for one-half cycle of the sinusoidal oscillation from $t_1$ to $t_2$, a second precharge period occurs from $t_2$ to $t_3$, during which the voltage is increased to $V_{max}$ with a positive polarity. This voltage is held during the hold period from $t_3$ to $t_4$, and is released by trigger pulse 94b, shown in FIG. 7B, at switch time $t_4$. The resulting voltage waveform at the resonant frequency of tuned circuit 50 begins with a quarter cycle from $t_4$ to $t'$, during which current flows through the gradient coil 54. The resulting spin phase, from Equation (9), is proportional to area 98, and therefore exactly cancels the spin phase, proportional to area 96, imparted by the initializing current half cycle from $t_1$ to $t_2$. When voltage waveform $V_c$ crosses the axis at $t = t'$, the subject has no preexisting spin phase and responds as if current $I_c$ were a cosine wave beginning at time $t'$.

Although the above embodiment of tuned circuit 50 is capable of generating sine wave and cosine wave oscillations, alternative preferred embodiments permit greater flexibility in the sinusoidal wave forms which may be applied. As will be discussed below, these alternative embodiments generally involve alternative switching circuits which may be used instead of switch 51 as shown in FIG. 4.

3. Alternative Switching Circuit

For best operation, switch 51 for use in tuned circuit 50 should be bidirectional for passing the current resulting from the sinusoidal oscillation in each direction. It should also be capable of passing very high currents, up to at least 1,000 amps, and a relatively high frequency, such as several kilohertz, with extremely low loss. A device which meets all these requirements is a back-to-back, or anti-parallel, thyristor pair, as shown in FIG. 8.

In FIG. 8, switching circuit 150 includes thyristor 152 for passing current from the capacitive circuit to the gradient coil in response to signal T1. Thyristor 154, on the other hand, passes current from the gradient coil to the capacitive circuit in response to signal T2. In parallel with the thyristors is a snubber circuit including resistor 156 and capacitor 158. The snubber circuit functions to protect against rapid changes in voltage, and is generally referred to as a dv/dt snubber.

Figure 9:
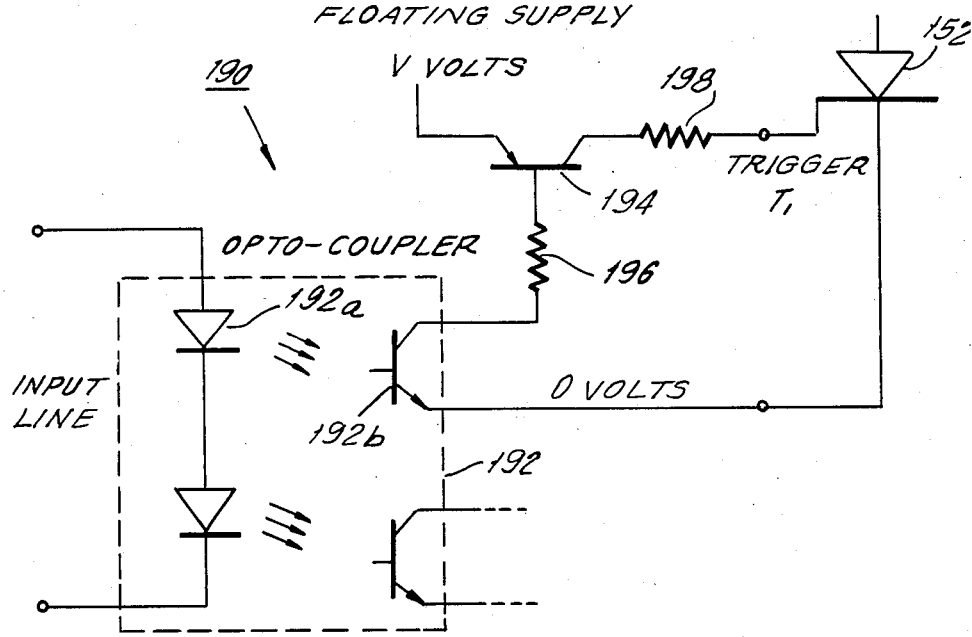
FIG. 9 is a schematic diagram of an optical coupling circuit for activating the switching circuit used in the invention.

A preferred circuit for connecting switching circuit 150 to the input line is the coupling circuit 190 shown in FIG. 9. FIG. 9 shows the input line being fed through opto-coupler 192. The input line may come from any source of input signals, but is most likely to be a signal from a waveform generation system (not shown) used to control the NMR imaging apparatus. In the particular embodiment shown in FIG. 9, a single input line from the system controls both trigger signals T1 and T2 although separate input lines could be provided for each trigger signal.

FIG. 9 illustrates in detail how the signal on the input line controls trigger signal T1. The input signal activates light-emitting diode (LED) 192a, causing it to emit light. The light from LED 192a is received by phototransistor 192b which pulls down the base voltage of pnp transistor 194 through resistor 196. As a result, transistor 194 becomes conductive, sending trigger pulse T1 through resistor 198 to thyristor 152. As shown in FIG. 9, an identical circuit can be used to drive thyristor 154.

It will be noted in FIG. 9 that the power supply is floating, with the emitter of transistor 192b being connected to a floating common line. This is necessary, because neither end of the thyristors is grounded to earth potential. The voltage drop across the thyristors 152, 154 will be between one and two volts at currents as high as 1,000 amps, so that the associated loss will appear as one or two milliohms. In designing the switching circuit 150, it is important to bear in mind that the total losses should not exceed approximately 25 milliohms.

Although switching circuit 150, used in tuned circuit 50 shown in FIG. 4, can provide a sine wave or a cosine wave as illustrated in FIGS. 5A and 7A, its usefulness is limited to high speed NMR imaging using a relatively homogeneous magnetic field. Therefore, the additional embodiments discussed below are useful to overcome inhomogeneity problems.

4. Second Embodiment

Some high speed NMR imaging methods require the formation of echoes in the subject. When the spin phase imparted by two opposite gradient pulses cancels as was the case for area 96 and area 98 in FIG. 7A, an echo results from which information can be extracted. For the sine wave and cosine wave gradient fields discussed above, it can be seen that echoes will be formed periodically during the sinusoidal oscillation of the gradient field. It may be preferable, however, due to magnetic field inhomogeneity, to use radio frequency (RF) pulse signals to create the echoes, these pulses being known, for example, as 180° RF pulses. When 180° RF pulse signals are used, the simultaneous use of unrectified sinusoidally oscillating gradient fields will result in no echoes. Therefore, if 180° RF pulses are used to form echoes, it is necessary that the gradient waveform be prevented from forming echoes.

Figure 10:
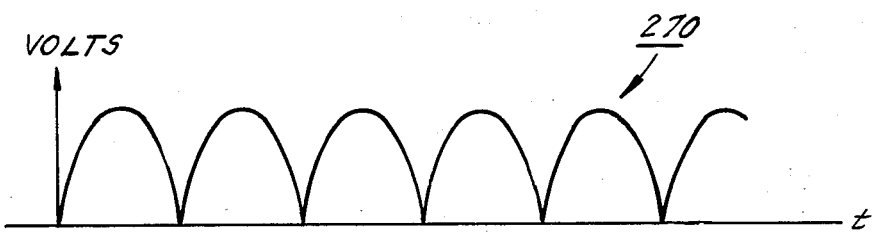
FIG. 10 shows a full-wave rectified sine wave produced by a second embodiment of the tuned circuit of the invention.

FIG. 10 shows a gradient waveform 270 which will not form echoes. As can be seen from FIG. 10, gradient wave 270 is the modulus of a sine wave, also referred to as a rectified sine wave. Because the spin phase imparted by gradient waveform 270 will always have one polarity, it will never form echoes. Similarly, the modulus of a cosine wave, also referred to as a rectified cosine wave, could be used as the gradient wave. The purpose of the second embodiment, therefore, is to produce rectified sine wave or cosine wave gradient fields to permit the use of 180° RF pulses to form echoes.

Figure 11:
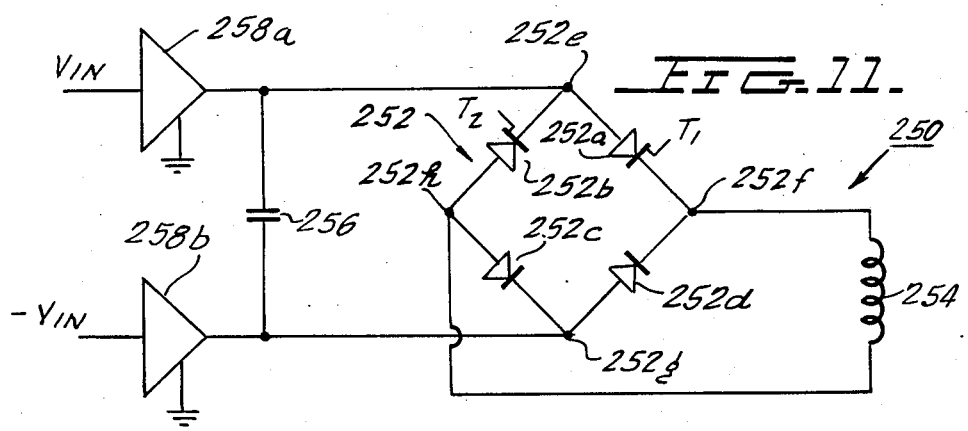
FIG. 11 is a schematic diagram of a second embodiment of the tuned circuit of the invention.

FIG. 11 shows tuned circuit 250 of the second embodiment. Like tuned circuit 50 shown in FIG. 4, tuned circuit 250 includes gradient coil 254 and capacitive circuit 256, as well as amplifiers 258a, 258b. Tuned circuit 250, however, includes bridge circuit 252 connected between capacitive circuit 256 and gradient coil 254. As shown in FIG. 11, one pair of opposite nodes of bridge circuit 252 are connected across the capacitive circuit 256, while the other pair of opposite nodes are connected across gradient coil 254.

The flow of current through gradient coil 252 is controlled by four components, thyristors 252a, 252b and diodes 252c, 252d. Thyristor 252a is activated by trigger signal T1, while thyristor 252b is activated by trigger signal T2. When both T1 and T2 are off, bridge circuit 252 prevents a circuit from being completed between capacitive circuit 256 and gradient coil 254, so that the energy stored in capacitive circuit 256 can be modified using amplifiers 258a and 258b without setting up an oscillation. When trigger signal T1 activates thyristor 252a, current flows from capacitive circuit 256 through node 252e and node 252f to gradient circuit 254, and back through nodes 252h and 252g to capacitive circuit 256. On the other hand, when trigger signal T2 activates thyristor 252b, current flows from capacitive circuit 256 through nodes 252g and 252f to gradient coil 254 and flows from gradient coil 254 through nodes 252h and 252e to capacitive circuit 256. This arrangement permits a rectified sinusoidal oscillation to be set up in which the current through the gradient coil 254 always flows in one direction.

FIG. 12A illustrates the operation of tuned circuit 250 to produce a rectified sine wave gradient field. Voltage waveform $V_c$ again represents both the driving voltage and the voltage across capacitive circuit 256. During a precharge period from $t_0$ to $t_1$ and a hold period from $t_1$ to $t_2$, both trigger signals T1, T2 are off, as shown in FIG. 12B. At $t=t'$, trigger signal T1 turns on, generating current waveform $I_c$ through the gradient coil 254. The T1 trigger pulse 294a shown in FIG. 12B causes current to flow through thyristor 252a and diode 252c resulting in the first current half cycle 274a. When all the oscillating energy is again in the capacitive circuit 256 at t'₁, the T1 trigger pulse 294a ends, and the T2 trigger pulse 294b begins, permitting current to flow through diode 252d and thyristor 252b, forming current half cycle 274b. At the end of current half cycle 274b, at t'₂, both trigger signals are off, resulting in a hold period, in which the oscillating energy is held in the capacitive circuit 256. During this hold period, a 180° RF pulse which forms an echo may be applied to the subject. Because no gradient fields are present, the power necessary to apply such RF pulses is greatly reduced. Then, when imaging resumes at t'₃, T1 trigger pulse 294c shown in FIG. 12B is applied, resulting in current half cycle 274c through the gradient coil 254.

As described in relation to FIG. 9, an optical coupling arrangement could be used to provide trigger signals T1 and T2. The trigger signals T1 and T2 can be applied separately or simultaneously to rectify the sinusoidal oscillations.

As discussed in relation to FIG. 7A, above, a rectified cosine wave could be obtained using a half amplitude pre-pulse of opposite polarity.

Although the tuned circuit 250 shown in FIG. 11 is adequate to produce the rectified sine wave and cosine wave, it may be desirable to have a more general circuit capable of operating in any desired manner. As described below, this can be done by combining features of the tuned circuit 250 shown in FIG. 11 with features of the switching circuit 150 shown in FIG. 8.

5. Third Embodiment

FIG. 13 shows a third embodiment of the invention in which tuned circuit 350 includes a bridge circuit similar to that in tuned circuit 250 of FIG. 11. In this embodiment, however, each side of the bridge circuit contains a switching circuit 352, 354, 356, 358 having the same structure as switching circuit 150 in FIG. 8. In other words, each switching circuit includes two back-to-back thyristors and a snubber circuit in parallel.

Tuned circuit 350 may be operated in the same manner as the previously described circuits, because it is a completely general embodiment. During precharging and holding periods, all of the switching circuits 352–358 can be turned off. During periods of non-rectified sinusoidal oscillation, one pair of opposite switching circuits 352, 356 or 354, 358 can be turned on. For rectified sine wave or cosine wave oscillation, the pairs of switching circuits may be alternately turned on.

The above embodiments of the invention could be used to produce modulated NMR gradient fields in a variety of techniques. As discussed above, the present invention is particularly applicable to high-speed NMR imaging.

6. Fourth Embodiment

As discussed above, the elimination of transients in modulated gradient fields is necessary for high-speed NMR imaging. The switching circuits of the present invention eliminate rise time transients by permitting the precharging of a capacitive circuit. In addition, the snubber circuit consisting of resistor 156 and capacitor 158, shown in FIG. 8, functions to reduce switching transients. It is also beneficial, however, to filter out any transient components at the operational NMR frequency. This prevents the ringing of the NMR receiver coil.

FIG. 14 shows a fourth embodiment providing filters to eliminate transient components at the operational NMR frequency. As shown in FIG. 14, switching circuit 450 operates in the manner described above to initiate sinusoidal oscillation of energy between gradient coil 454 and capacitive circuit 456. Amplifiers 458a, 458b provide additional energy to maintain the sinusoidal oscillation. FIG. 14 also shows, in dotted line, shielding box 460, which is grounded to earth, and which contains switching circuit 450 and capacitive circuit 456. At each entry and exit from shielding box 460, a filter 462, 464, 466, 468 is connected in the line to eliminate transient components at the operational NMR frequency.

Filters 462, 464, 466, 468 are preferably low pass filters which permit the oscillations at the gradient field modulation frequency to pass through, but which filter out any frequencies in the NMR frequency range. For example, low pass filters passing all frequencies from DC to 20 KHz could be used. Alternatively, filters 460, 464, 466, 468 could be filters with a "notch" response resulting in high circuit impedance at the NMR frequency. Because of the high energy oscillations, these filters must be constructed from heavy duty components.

Although the present invention has been described in connection with a plurality of preferred embodiments thereof, many other variations and modifications will now become apparent to those skilled in the art. It is preferred, therefore, that the present invention be limited not by the specific disclosure herein, but only by the appended claims.

I claim:

1. A circuit for generating a gradient field for a nuclear magnetic resonance imaging system comprising:
   input power circuitry for providing input power;
   a capacitive circuit connected to the input power circuitry for storing energy in response to the input power;
   a gradient coil; and
   circuitry for connecting the gradient coil to the capacitive circuit, the gradient coil and the capacitive circuit when connected by the connecting circuitry being resonant at a resonant frequency to exchange energy in a sinusoidal manner at the resonant frequency for providing a sinusoidally modulated gradient field; the input power circuitry being operable for providing input power at about the resonant frequency to maintain the sinusoidally modulated gradient field at about a constant amplitude; the connecting circuitry comprising a switch circuit connected between the capacitive circuit and the gradient coil for closing and opening a switched connection therebetween to begin and end a sinusoidal exchange of energy for providing the sinusoidally modulated gradient field.

2. The circuit of claim 1 in which the capacitive circuit comprises an adjustable capacitance for varying the resonant frequency.

3. The circuit of claim 1 in which the capacitive circuit has a first connecting node and a second connecting node, the input voltage being provided across the first and second connecting nodes.

4. The circuit of claim 1 in which the capacitive circuit has a first connecting node connected to the switch circuit and a second connecting node; the gradient coil having a third connecting node connected to the switch circuit and a fourth connecting node connected to the second connecting node of the capacitive circuit; the capacitive circuit and the gradient coil being connected in parallel when the switched connection is closed.

5. The circuit of claim 4 in which the switch circuit closes and opens the switched connection in response to input signals from an external source, the switch circuit comprising a first thyristor connected for permitting a flow of current from the first connecting node to the third connecting node in response to the input signals and a second thyristor connected for permitting a flow of current from the third connecting node to the first connecting node in response to the input signals.

6. The circuit of claim 5 in which the switch circuit further comprises an optical coupling circuit for receiving the input signals from the external source.

7. The circuit of claim 5 in which the switch circuit further comprises a snubber circuit connected in parallel to the first and second thyristors.

8. The circuit of claim 1 in which the switch circuit closes and opens the switched connection in response to input signals from an external source; the gradient coil providing the gradient field when current flows therethrough in one of first and second directions; the switch circuit comprising a bridge circuit for selectively providing the flow of current through the gradient coil in one of the first and second directions.

9. The circuit of claim 8 in which the bridge circuit has first, second, third and fourth corner nodes, the capacitive circuit having a first connecting node connected to the first corner node and a second connecting node connected to the third corner node, the gradient coil having a third connecting node connected to the second corner node and a fourth connecting node connected to the fourth corner node.

10. The circuit of claim 9 in which the bridge circuit further comprises a first switching thyristor connected for permitting a flow of current from the first corner node to the second corner node in response to the input signals and a second switching thyristor connected for permitting a flow of current from the fourth corner node to the first corner node in response to the input signals.

11. The circuit of claim 10 in which the bridge circuit further comprises a first diode connected for permitting a flow of current from the fourth corner node to the third corner node and a second diode connected for permitting a flow of current from the third corner node to the second corner node.

12. The circuit of claim 9 in which the bridge circuit comprises four side circuits, each side circuit being connected for responding to at least one switching signal for selectively permitting a flow of current between a respective pair of corner nodes for providing the current flow through the gradient coil in a selected one of the first and second directions, one of the corner nodes in each respective pair being connected to the capacitive circuit and the other corner node in each respective pair being connected to the gradient coil.

13. The circuit of claim 12 in which each side circuit comprises a respective first switching circuit connected for permitting a flow of current from the capacitive circuit to the gradient coil and a respective second switching circuit connected for permitting a flow of current from the gradient coil to the capacitive circuit.

14. The circuit of claim 13 in which each of the respective first and second switching circuits of each side circuit comprises a respective thyristor.

15. The circuit of claim 14 in which each of the respective first and second switching circuits of each side circuit further comprises an input circuit for providing the input signals to the respective thyristor.

16. The circuit of claim 14 in which each side circuit further comprises a snubber circuit connected in parallel to the respective thyristors of the respective first and second switching circuits.

17. A method of applying a gradient field in a nuclear magnetic resonance imaging system having a gradient coil arranged near a subject, comprising:
(A) storing energy in a capacitive circuit;
(B) closing a switch circuit to begin a sinusoidal exchange of energy at about a resonant frequency between the capacitive circuit and the gradient coil and to begin a sinusoidally modulated gradient field generated by the gradient coil and applied to the subject;
(C) providing input power to maintain the sinusoidal exchange of energy between the capacitive circuit and the gradient coil at about a constant amplitude and at about the resonant frequency and to maintain the sinusoidally modulated gradient field at about a constant amplitude; and
(D) opening the switch circuit when substantially all the energy being exchanged is in the capacitive circuit to stop the sinusoidal exchange of energy and the sinusoidally modulated gradient field.

18. The method of claim 17, further comprising:
(E) applying a radio frequency pulse signal to the subject after the switch circuit opening step.

19. The method of claim 18, further comprising repeating steps B, C, D and E to generate a series of sinusoidally modulated gradient field pulses and, during each period between the gradient field pulses, to apply a radio frequency pulse signal.

20. The method of claim 17 in which the storing step comprises:
(A1) increasing the energy stored in the capacitive circuit to a predetermined amount; and
(A2) holding the predetermined amount of energy in the capacitive circuit.

21. The method of claim 20 in which the switch closing step comprises beginning a sine wave gradient field.

22. The method of claim 20 in which the energy increasing substep comprises:
(A1a) charging the capacitive circuit to store an initial amount of energy in a first polarity;
(A1b) initially closing the switch circuit to permit the initial amount of energy to pass through the gradient coil and into the capacitive circuit in a second polarity opposite the first polarity to impart spin phase to nuclear systems of the subject; and
(A1c) adding energy to the initial amount of energy until the predetermined amount of energy is stored in the capacitive circuit in the second polarity.

23. The method of claim 22 in which the closing step comprises:
(B1) cancelling the spin phase imparted by the initially closing step; and
(B2) beginning a cosine wave gradient field.

24. The method of claim 17 in which the supplying step comprises permitting current to flow through the gradient coil in only one direction.

25. The method of claim 24 in which the permitting step comprises switching a bridge circuit in the switching circuit whenever the sinusoidally exchanged energy is stored in the capacitive circuit.

26. The method of claim 17, further comprising collecting imaging information from the subject during the input power providing step.

27. The method of claim 26, further comprising:

(F) holding the energy being exchanged in the capacitive circuit after the switch circuit opening step.

28. The method of claim 27, further comprising repeating steps B, C, D and F to collect further imaging information.

29. A circuit for generating a gradient field for a nuclear magnetic resonance imaging system comprising:
   input power circuitry for providing input power;
   a capacitive circuit connected to the input power circuitry for storing energy in response to the input power;
   a gradient coil for providing a gradient field when a current flows therethrough in one of first and second directions; and
   circuitry for connecting the gradient coil to the capacitive circuit, the gradient coil and the capacitive circuit when connected by the connecting circuitry being resonant at a resonant frequency to provide a current flowing through the gradient coil in a sinusoidal manner at the resonant frequency for providing a sinusoidally modulated gradient field; the input power circuitry being operable for providing input power at about the resonant frequency to maintain the sinusoidally modulated gradient field at about a constant amplitude; the connecting circuitry comprising a switch circuit connected between the capacitive circuit and the gradient coil for closing and opening a switched connection therebetween to begin and end the sinusoidal flow of current for providing the sinusoidally modulated gradient field, the switch circuit being operable to be opened after a selected half cycle of the sinusoidal flow of current and thereafter to be selectively closed to provide the current flow through the gradient coil in a selected one of the first and second directions.

30. The circuit of claim 29 in which the switch circuit closes and opens the switched connection in response to input signals from an external source; the switch circuit comprising a bridge circuit for selectively providing the flow of current through the gradient coil in the selected one of the first and second directions.

31. A method of applying a gradient field in a nuclear magnetic resonance imaging system having a gradient coil arranged near a subject, comprising:
   (A) storing energy in a capacitive circuit;
   (B) selectively closing a switch circuit to begin a sinusoidal current flow at about a resonant frequency between the capacitive circuit and the gradient coil and to begin a sinusoidally modulated gradient field generated by the gradient coil and applied to the subject; the switch circuit being selectively closed to begin the sinusoidal current flow in a selected one of first and second directions through the gradient coil;
   (C) providing input power to maintain the sinusoidal current flow between the capacitive circuit and the gradient coil at about a constant amplitude and at about the resonant frequency and to maintain the sinusoidally modulated gradient field at about a constant amplitude;
   (D) opening the switch circuit after a selected half cycle of the sinusoidal current flow to stop the sinusoidal current flow and the sinusoidally modulated gradient field; and
   (E) thereafter repeating steps B, C and D to provide a selected sinusoidally modulated gradient field.

32. The method of claim 31 in which the step of opening the switch circuit comprises opening the switch circuit after only a single half cycle of the sinusoidal current flow, the step of selectively closing the switch circuit comprising closing the switch circuit so that the sinusoidal current flow is always in the same selected one of the first and second directions.

* * * * *